(12) United States Patent
Ohno et al.

(10) Patent No.: US 10,840,368 B2
(45) Date of Patent: Nov. 17, 2020

(54) SEMICONDUCTOR DEVICE

(71) Applicants: KABUSHIKI KAISHA TOSHIBA, Minato-ku (JP); TOSHIBA ELECTRONIC DEVICES & STORAGE CORPORATION, Minato-ku (JP)

(72) Inventors: Tetsuya Ohno, Nomi (JP); Hiroaki Katou, Nonoichi (JP); Kenya Kobayashi, Nonoichi (JP); Toshifumi Nishiguchi, Hakusan (JP); Saya Shimomura, Komatsu (JP)

(73) Assignees: KABUSHIKI KAISHA TOSHIBA, Minato (JP); TOSHIBA ELECTRONIC DEVICES & STORAGE CORPORATION, Minato (JP)

( * ) Notice: Subject to any disclaimer, the term of this patent is extended or adjusted under 35 U.S.C. 154(b) by 0 days.

(21) Appl. No.: 16/406,547

(22) Filed: May 8, 2019

(65) Prior Publication Data
US 2020/0273978 A1 Aug. 27, 2020

(30) Foreign Application Priority Data
Feb. 25, 2019 (JP) .................. 2019-031208

(51) Int. Cl.
H01L 29/78 (2006.01)
H01L 29/08 (2006.01)
(Continued)

(52) U.S. Cl.
CPC ...... H01L 29/7802 (2013.01); H01L 29/0865 (2013.01); H01L 29/1095 (2013.01);
(Continued)

(58) Field of Classification Search
CPC ............ H01L 29/7802; H01L 29/1095; H01L 29/41741; H01L 29/41775; H01L 29/66712; H01L 29/0865
See application file for complete search history.

(56) References Cited

U.S. PATENT DOCUMENTS 8,866,220 B2   10/2014   Kobayashi
9,337,283 B2    5/2016   Nishiguchi
(Continued)

FOREIGN PATENT DOCUMENTS

JP   2013-062344   4/2013
JP   2014-027182   2/2014
(Continued)

OTHER PUBLICATIONS

Nagel et al.; Stress-Induced Void Formation in Interlevel Polysilicon Films during Polybuffered Local Oxidation of Silicon; J. Electrochem. Soc., vol. 140, 1993, pp. 2356-2359 (Year: 1993).*

Primary Examiner — Syed I Gheyas
(74) Attorney, Agent, or Firm — Oblon, McClelland, Maier & Neustadt, L.L.P.

(57) ABSTRACT

According to an embodiment, a semiconductor device includes a first electrode, a first semiconductor region, second semiconductor regions, third semiconductor regions, a first conductive portion, a gate electrode, and a second electrode. The gate electrode includes a first electrode portion and a second electrode portion. The first electrode portion opposes a portion of the first semiconductor region, one of the second semiconductor regions, and one of the third semiconductors in a first direction perpendicular to a second direction. The second electrode portion is located between the first electrode portion and another one of the third semiconductor regions in the first direction. The second electrode portion opposes another portion of the first semiconductor region, another one of the second semiconductor (Continued)

regions, and the other one of the third semiconductor regions. A second insulating portion including a void is provided between the first electrode portion and the second electrode portion.

7 Claims, 12 Drawing Sheets

(51) Int. Cl.
    *H01L 29/66*     (2006.01)
    *H01L 29/417*     (2006.01)
    *H01L 29/10*     (2006.01)

(52) U.S. Cl.
    CPC .. *H01L 29/41741* (2013.01); *H01L 29/41775* (2013.01); *H01L 29/66712* (2013.01)

(56) References Cited

U.S. PATENT DOCUMENTS

| | | | |
|---|---|---|---|
| 9,917,183 | B2 | 3/2018 | Arai |
| 10,121,892 | B2 | 11/2018 | Nishiwaki |
| 2012/0199899 | A1 | 8/2012 | Kobayashi et al. |
| 2013/0062688 | A1 | 3/2013 | Kobayashi |
| 2013/0069150 | A1* | 3/2013 | Matsuoka ......... H01L 29/42376 257/330 |
| 2014/0179094 | A1* | 6/2014 | Kobayashi ........ H01L 29/66666 438/589 |

FOREIGN PATENT DOCUMENTS

| | | |
|---|---|---|
| JP | 5627494 | 11/2014 |
| JP | 5799046 | 10/2015 |
| JP | 2016-167519 | 9/2016 |
| JP | 6426642 | 11/2018 |

\* cited by examiner

SEMICONDUCTOR DEVICE

CROSS-REFERENCE TO RELATED APPLICATIONS

This application is based upon and claims the benefit of priority from Japanese Patent Application No. 2019-031208, filed on Feb. 25, 2019; the entire contents of which are incorporated herein by reference.

FIELD

Embodiments described herein relate generally to a semiconductor device.

BACKGROUND

A semiconductor device such as MOSFET (metal-oxide-semiconductor field-effect transistors) is used for applications such as power conversion. It is desirable that the power consumption of the semiconductor device is small.

DETAILED DESCRIPTION

Figure 1:
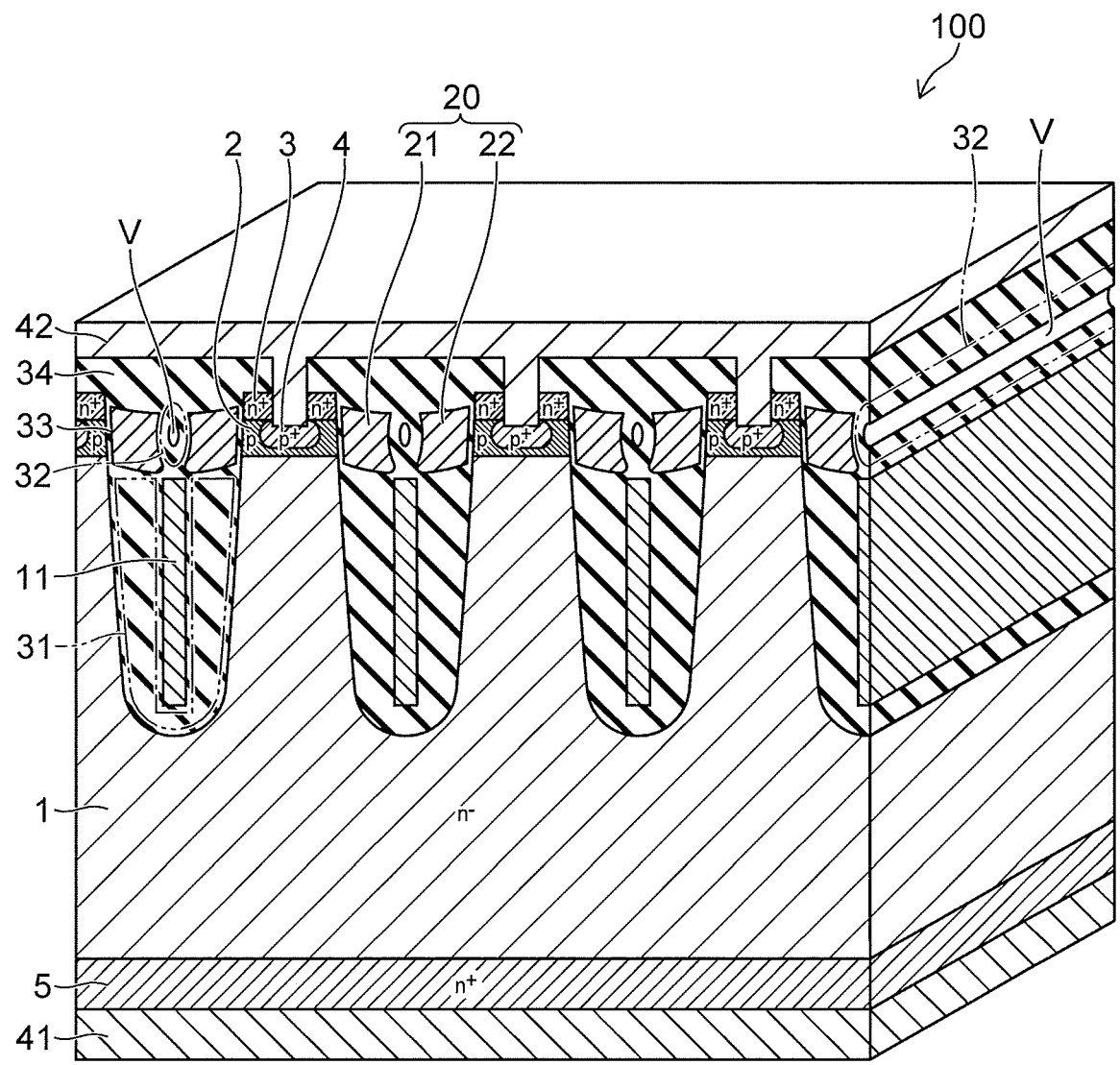
FIG. 1 is a perspective cross-sectional view showing a portion of a semiconductor device according to an embodiment.

According to an embodiment, a semiconductor device includes a first electrode, a first semiconductor region, a plurality of second semiconductor regions, a plurality of third semiconductor regions, a first conductive portion, a gate electrode, and a second electrode. The first semiconductor region is provided on the first electrode. The first semiconductor region is of a first conductivity type and is electrically connected to the first electrode. The plurality of second semiconductor regions are provided on the first semiconductor region. The plurality of second semiconductor regions are of a second conductivity type. The plurality of third semiconductor regions are selectively provided on the respective second semiconductor regions. The plurality of third semiconductor regions are of the first conductivity type. The first conductive portion is provided inside the first semiconductor region with a first insulating portion interposed. The gate electrode is provided on the first conductive portion and the first insulating portion. The gate electrode is separated from the first conductive portion. The gate electrode includes a first electrode portion and a second electrode portion. The first electrode portion opposes, with a first gate insulating portion interposed, a portion of the first semiconductor region, one of the plurality of second semiconductor regions, and one of the plurality of third semiconductors in a first direction perpendicular to a second direction. The second direction is from the first electrode toward the first semiconductor region. The second electrode portion is located between the first electrode portion and another one of the plurality of third semiconductor regions in the first direction. The second electrode portion opposes, with a second gate insulating portion interposed, another portion of the first semiconductor region, another one of the plurality of second semiconductor regions, and the other one of the plurality of third semiconductor regions. A second insulating portion including a void is provided between the first electrode portion and the second electrode portion. The second electrode is provided on the plurality of second semiconductor regions and the plurality of third semiconductor regions. The second electrode is electrically connected to the plurality of second semiconductor regions, the plurality of third semiconductor regions, and the first conductive portion.

Embodiments of the invention will now be described with reference to the drawings.

The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

In the drawings and the specification of the application, components similar to those described thereinabove are marked with like reference numerals, and a detailed description is omitted as appropriate.

In the following descriptions and drawings, notations of $n^+$, $n^-$ and $p^+$, $p$ represent relative heights of impurity concentrations in conductivity types. That is, the notation with "+" shows a relatively higher impurity concentration than an impurity concentration for the notation without any of "+" and "−". The notation with "−" shows a relatively lower impurity concentration than the impurity concentration for the notation without any of them. These notations represent relative height of a net impurity concentration after mutual compensation of these impurities when respective regions include both of a p-type impurity and an n-type impurity.

The embodiments described below may be implemented by reversing the p-type and the n-type of the semiconductor regions.

FIG. 1 is a perspective cross-sectional view showing a portion of a semiconductor device according to the embodiment.

The semiconductor device 100 according to the embodiment shown in FIG. 1 is MOSFET. The semiconductor device 100 according to the embodiment includes an $n^-$-type (a first conductivity type) drift region 1 (a first semiconductor region), a p-type (a second conductivity type) base region 2 (a second semiconductor region), an $n^+$-type source region 3 (a third semiconductor region), a $p^+$-type contact region 4, an $n^+$-type drain region 5, a first conductive portion 11, a gate electrode 20, a first insulating portion 31, a second insulating portion 32, a drain electrode 41 (a first electrode), and a source electrode 42 (a second electrode).

An XYZ orthogonal coordinate system is used in the description of the embodiments. Hereinafter, a direction from the drain electrode 41 toward the n⁻-type drift region 1 is taken as a Z-direction (a second direction). Two mutually-orthogonal directions perpendicular to the Z-direction are taken as an X-direction (a first direction) and a Y-direction. For the description, the direction from the drain electrode 41 toward the n⁻-type drift region 1 is called "up;" and the reverse direction is called "down." These directions are based on the relative positional relationship between the drain electrode 41 and the n⁻-type drift region 1 and are independent of the direction of gravity.

The drain electrode 41 is provided on the lower surface of the semiconductor device 100. The n⁺-type drain region 5 is provided on the drain electrode 41 and is electrically connected to the drain electrode 41. The n⁻-type drift region 1 is provided on the n⁺-type drain region 5. The n⁻-type drift region 1 is electrically connected to the drain electrode 41 via the n⁺-type drain region 5. The p-type base region 2 is provided on the n⁻-type drift region 1. The n⁺-type source region 3 and the p⁺-type contact region 4 are selectively provided on the p-type base region 2.

The first conductive portion 11 is a field plate electrode, and is provided inside the n⁻-type drift region 1 with the first insulating portion 31 interposed. The first conductive portion 11 may be connected to an electrode for applying a voltage to the n⁺-type source region 3. The first insulating portion 31 is a field plate insulating film, and is provided for insulating the first conductive portion 11 and other regions. The gate electrode 20 is provided on the first conductive portion 11 and the first insulating portion 31. The specific structure of the gate electrode 20 will be described later.

The source electrode 42 is provided on the n⁺-type source region 3 and the p⁺-type contact region 4. The source electrode 42 is electrically connected to the first conductive portion 11, the n⁺-type source region 3, and the p⁺-type contact region 4. An insulating portion 34 is provided between the gate electrode 20 and the source electrode 42. The insulating portion 34 is an interlayer insulating film, and the gate electrode 20 and the source electrode 42 are electrically separated from each other.

Components provided in the semiconductor device 100 such as the p-type base region 2, the n⁺-type source region 3, the p⁺-type contact region 4, the first conductive portion 11, and the gate electrode 20 each are multiply provided in the X-direction and each extend along the Y-direction. The source electrode 42 is electrically connected to the p-type base regions 2, the n⁺-type source regions 3, and the first conductive portions 11.

Each gate electrode 20 includes a first electrode portion 21 and a second electrode portion 22 separated from each other in the X-direction. The second insulating portion 32 is provided between the first electrode portion 21 and the second electrode portion 22. A void V is provided inside the second insulating portion 32. The void V is surrounded by the second insulating portion 32 in the X-Z plane.

The first electrode portion 21 is located between the second electrode portion 22 and one of the n⁺-type source regions 3 in the X-direction. The second electrode portion 22 is located between the first electrode portion 21 and another one of the n⁺-type source regions 3 in the X-direction.

The first electrode portion 21 is opposed to, with a gate insulating portion 33 (a first gate insulating portion) interposed, a portion of the n⁻-type drift region 1, one of the p-type base regions 2, and the one of the n⁺-type source regions 3 in the X-direction. The second electrode portion 22 is opposed to, with another gate insulating portion 33 (a second gate insulating portion) interposed, another portion of the n⁻-type drift region 1, another one of the p-type base regions 2, and the other one of the n⁺-type source regions 3 in the X-direction.

The operation of the semiconductor device 100 will be described.

In a state where a positive voltage is applied to the drain electrode 41 with respect to the source electrode 42, a voltage higher than a threshold is applied to the gate electrode 20. Thereby, a channel (an inversion layer) is formed in the p-type base region 2, and the semiconductor device 100 is set to ON-state. Electrons flow from the source electrode 42 to the drain electrode 41 through this channel. Thereafter, when the voltage applied to the gate electrode 20 becomes lower than the threshold, the channel in the p-type base region 2 disappears, and the semiconductor device 100 is set to OFF-state.

When the semiconductor device 100 is switched to the OFF-state, the positive voltage applied to the drain electrode 41 with respect to the source electrode 42 increases. A depletion layer spreads from the interface between the first insulating portion 31 and the n⁻-type drift region 1 toward the n⁻-type drift region 1 by the increase of the positive voltage. The breakdown voltage of the semiconductor device 100 can be increased by the spread of the depletion layer. Or, the on-resistance of the semiconductor device 100 can be reduced by increasing the n-type impurity concentration in the n⁻-type drift region 1 while maintaining the breakdown voltage of the semiconductor device 100.

An example of the material of each component of the semiconductor device 100 will be described.

The n⁻-type drift region 1, the p-type base region 2, the n⁺-type source region 3, the p⁺-type contact region 4, and the n⁺-type drain region 5 include silicon (Si) or silicon carbide (SiC) as a semiconductor material. When silicon is used as the semiconductor material, arsenic (As), phosphorus (P), or antimony (Sb) can be used as the n-type impurity. Boron (B) can be used as the p-type impurity.

The first conductive portion 11 and the gate electrode 20 include a conductive material such as polysilicon. An impurity may be added to the conductive material.

The first insulating portion 31, the second insulating portion 32, the gate insulating portion 33, and the insulating portion 34 include an insulating material such as silicon oxide. The second insulating portion 32 may include an impurity (for example, phosphorus). For example, the impurity concentration in the second insulating portion 32 is higher than the impurity concentration in the first insulating portion 31. The impurity concentration in the first insulating portion 31 may be zero.

The drain electrode 41 and the source electrode 42 include a metal such as aluminum.

FIG. 2A, FIG. 2B, FIG. 3A, FIG. 3B, FIG. 4A, and FIG. 4B are process cross-sectional views showing the manufacturing processes of the semiconductor device according to the embodiment.

An example of a method for manufacturing the semiconductor device 100 according to the embodiment will be described with reference to FIG. 2A to FIG. 4B.

Figure 2A:
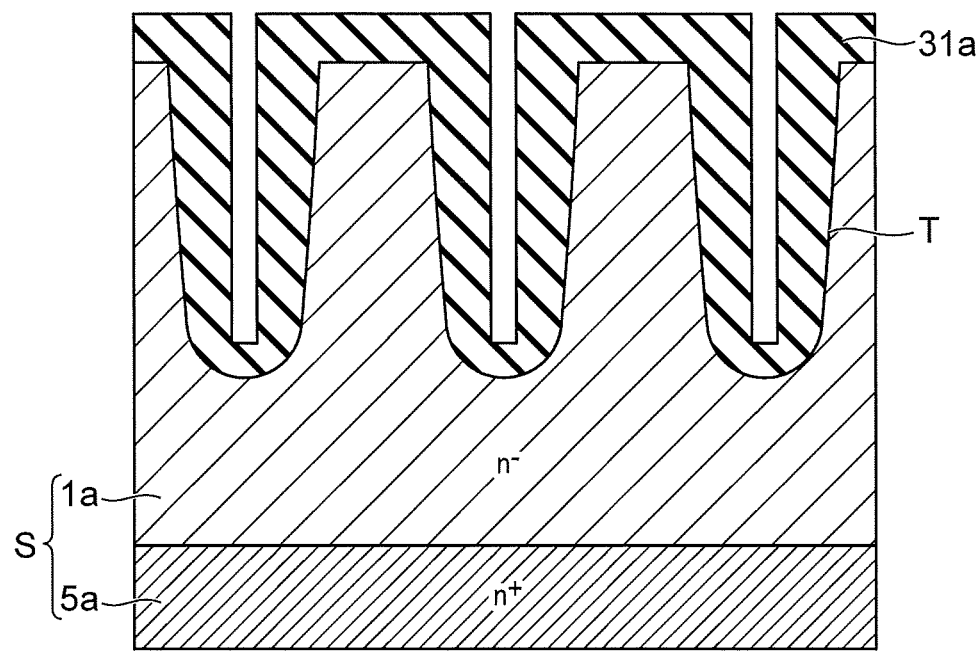
FIG. 2A, FIG. 2B, FIG. 3A, FIG. 3B, FIG. 4A, and FIG. 4B are process cross-sectional views showing manufacturing processes of the semiconductor device according to the embodiment.

A semiconductor substrate S is prepared. The semiconductor substrate S includes an n⁺-type semiconductor region 5a and an n⁻-type semiconductor region 1a provided on the n⁺-type semiconductor region 5a. A plurality of trenches T extending along the Y-direction are formed on the upper surface of the n⁻-type semiconductor region 1a. The insulating layer 31a is formed along the upper surface of the n⁻-type semiconductor region 1a and the inner surfaces of the trenches T as shown in FIG. 2A. The insulating layer 31a is formed by thermally oxidizing the semiconductor substrate S. Or, the insulating layer 31a is formed by depositing an insulating material (for example, silicon oxide) along the upper surface of the n⁻-type semiconductor region 1a and the inner surfaces of the trenches T using chemical vapor deposition (CVD).

Figure 2B:
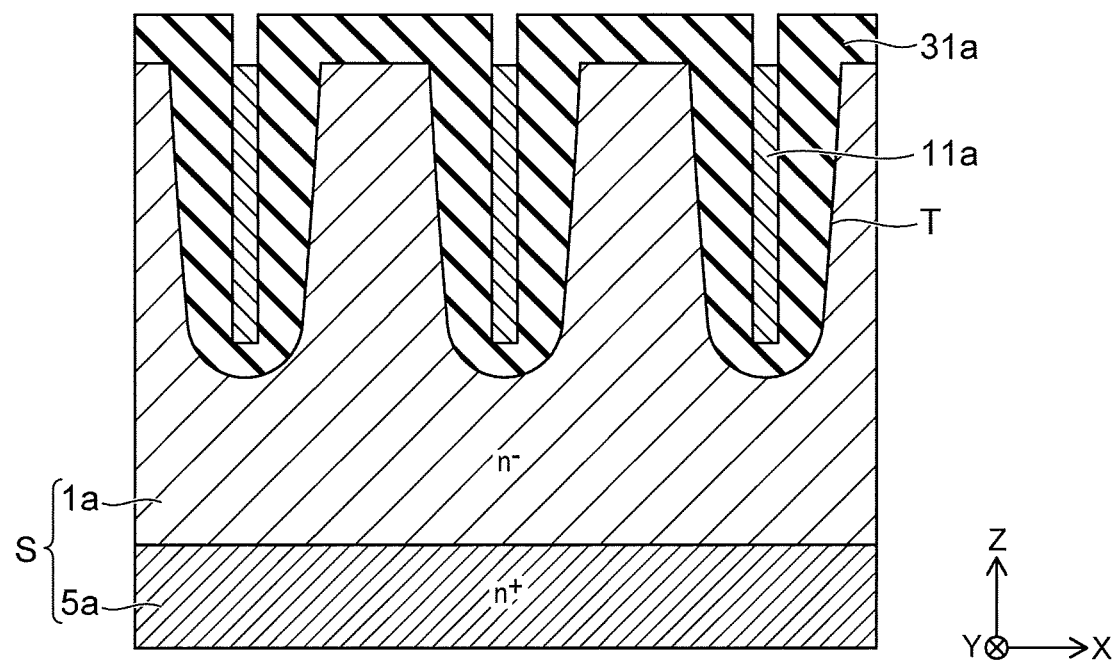

A conductive layer 11a filling the trenches T is formed on the insulating layer 31a. The conductive layer 11a is formed by depositing a conductive material such as polysilicon using CVD. The conductive layer 11a is formed using a method of diffusing a conductive impurity (for example, phosphorus). Or, the conductive layer 11a may be formed by depositing doped polysilicon using CVD. The upper surface of the conductive layer 11a is caused to recede by removing a portion of the conductive layer 11a using chemical dry etching (CDE) or the like. Thereby, as shown in FIG. 2B, a plurality of conductive layers 11a provided separately inside the respective trenches T are formed.

Figure 3A:
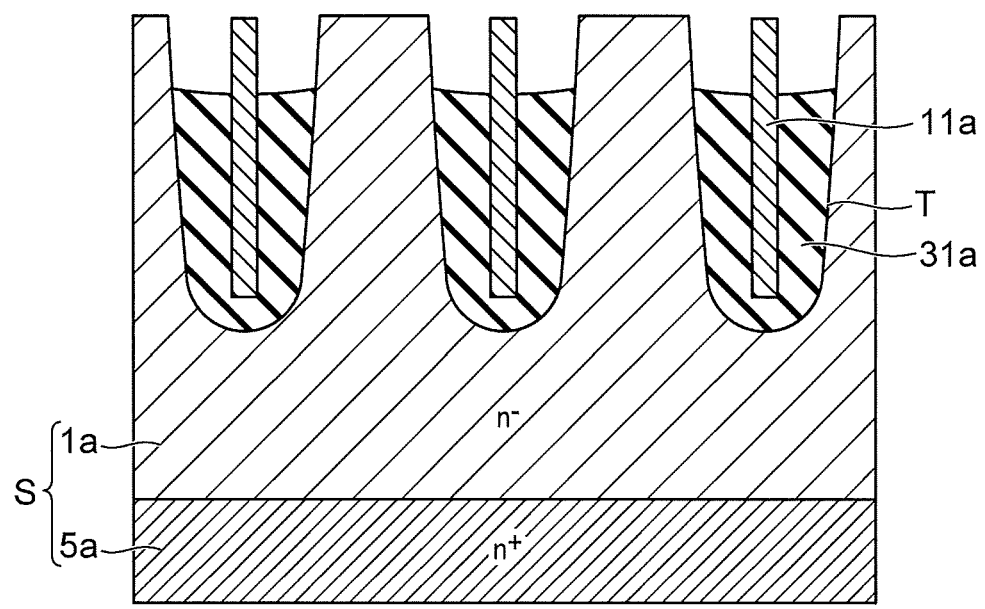

The upper surface of the insulating layer 31a is caused to recede using wet etching or CDE. Thereby, as shown in FIG. 3A, the upper portion of each conductive layer 11a is exposed. Hereinafter, the exposed upper portion of the conductive layer 11a is called an exposed portion. In this state, a first oxidation process and a second oxidation process described below are performed.

In the first oxidation process, the semiconductor substrate S is heated at a first temperature in a gas including oxygen. Thereby, the conductive layer 11a and the n⁻-type semiconductor region 1a are oxidized. The first temperature is set such that the oxidation rate of the conductive layer 11a is faster than the oxidation rate of the n⁻-type semiconductor region 1a. For example, the oxidation rate is represented by the thickness of the conductive layer or the semiconductor region oxidized per unit time. When the conductive layer 11a includes polysilicon to which phosphorus is added and the n⁻-type semiconductor region 1a includes single crystal silicon, it is desirable that the first temperature is set to not less than 750° C. and not more than 850° C.

For example, the semiconductor substrate S is heated in a gas including oxygen ($O_2$) and hydrogen ($H_2$) in the first oxidation process. The gas may further include nitrogen ($N_2$). The semiconductor substrate S may be heated in a gas including ozone ($O_3$) or in water vapor.

Figure 3B:
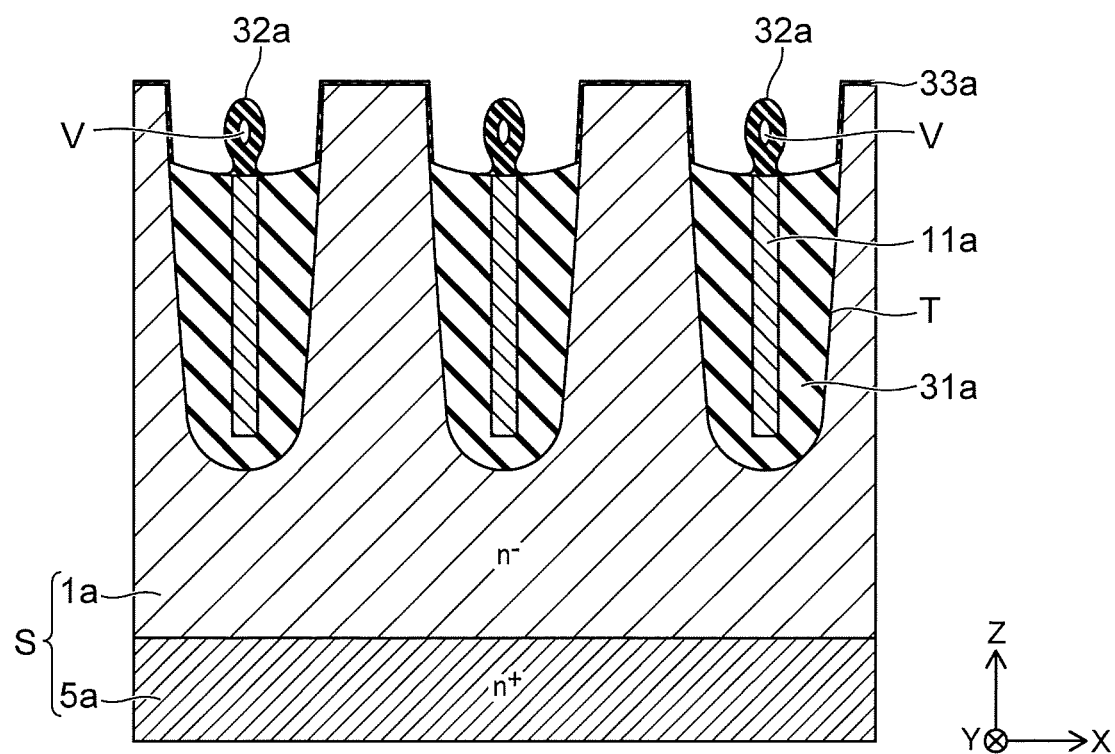

For example, the first oxidation process is continued until whole of the exposed portion of the conductive layer 11a is oxidized. By oxidizing the exposed portion of the conductive layer 11a, an insulating layer 32a is formed as shown in FIG. 3B. At this time, the void V is formed inside the insulating layer 32a. In addition, an insulating layer 33a is formed on the exposed surface of the n⁻-type semiconductor region 1a by the first oxidation process.

The void V is considered to be formed for the following reason.

There is a seam at the center of the conductive layer 11a in the X-direction. The seam is a minute gap and extends along the Z-direction. The seam is formed, for example, as follows.

When forming the conductive layer 11a in the trench T, the conductive materials are deposited along the direction perpendicular to the inner surface of the insulating layer 31a. For example, the inner surface includes an inner side-surface along the Z-direction and another inner side-surface along the Z-direction. The inner side-surface and the other inner side-surface are opposed to each other in the X-direction. The conductive materials are deposited along the X-direction on the inner side-surface and the other inner side-surface. As the deposition of the conductive materials proceeds, the conductive materials deposited on the inner side-surface contacts the other conductive materials deposited on the other inner side-surface at the center of the trench T in the X-direction. At this time, a space not filled with the materials is generated at the center of the trench T in the X-direction, due to the variation in the deposition amount at each point on the inner surface. As a result, the seam is formed.

When the exposed portion of the conductive layer 11a is oxidized, an outward force along the direction perpendicular to the oxidized surface is generated. For example, when the side-surface of the exposed portion is oxidized, an outward force along the X-direction is generated. This outward force is considered to increase as the oxidation rate increases. By performing the first oxidation process in which the oxidation rate of the conductive layer 11a is fast, the left and right sides of the exposed portion are pulled in opposite directions from the seam. As a result, the void V is formed at the portion where the seam of the exposed portion was present.

The second oxidation process is performed after the first oxidation process. The semiconductor substrate S is heated at a second temperature in a gas including oxygen in the second oxidation process. The second temperature is set higher than the first temperature. It is desirable that the second temperature is set to not less than 950° C. and not more than 1100° C. The second oxidation process is performed to increase the thickness of the insulating layer 33a.

Figure 4A:
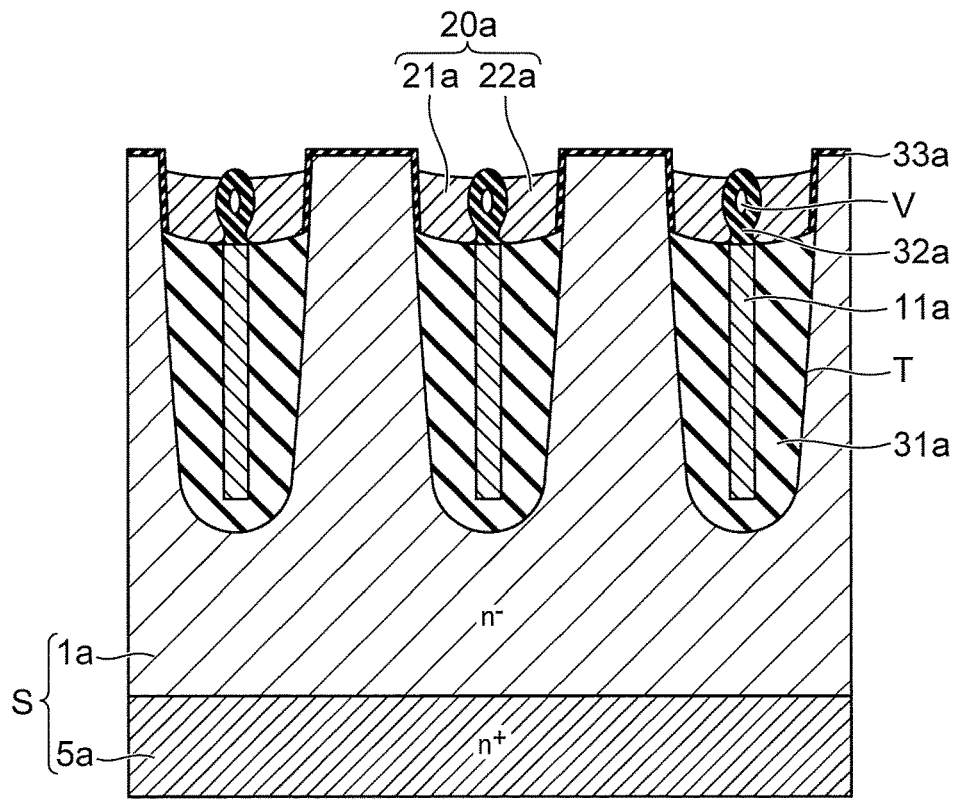

A conductive layer 20a filling the trenches T is formed on the insulating layers 31a to 33a. The conductive layer 20a is formed by depositing a conductive material such as polysilicon using CVD. The conductive layer 20a is formed using a method of diffusing a conductive impurity (for example, phosphorus). Or, conductive layer 20a may be formed by depositing doped polysilicon using CVD. The upper surface of the conductive layer 20a is caused to recede by removing a portion of the conductive layer 20a using CDE or the like. Thereby, as shown in FIG. 4A, a plurality of conductive layers 20a are respectively formed in the trenches T. Each conductive layer 20a includes a first conductive portion 21a and a second conductive portion 22a which are divided in the X-direction by the insulating layer 32a.

Figure 4B:
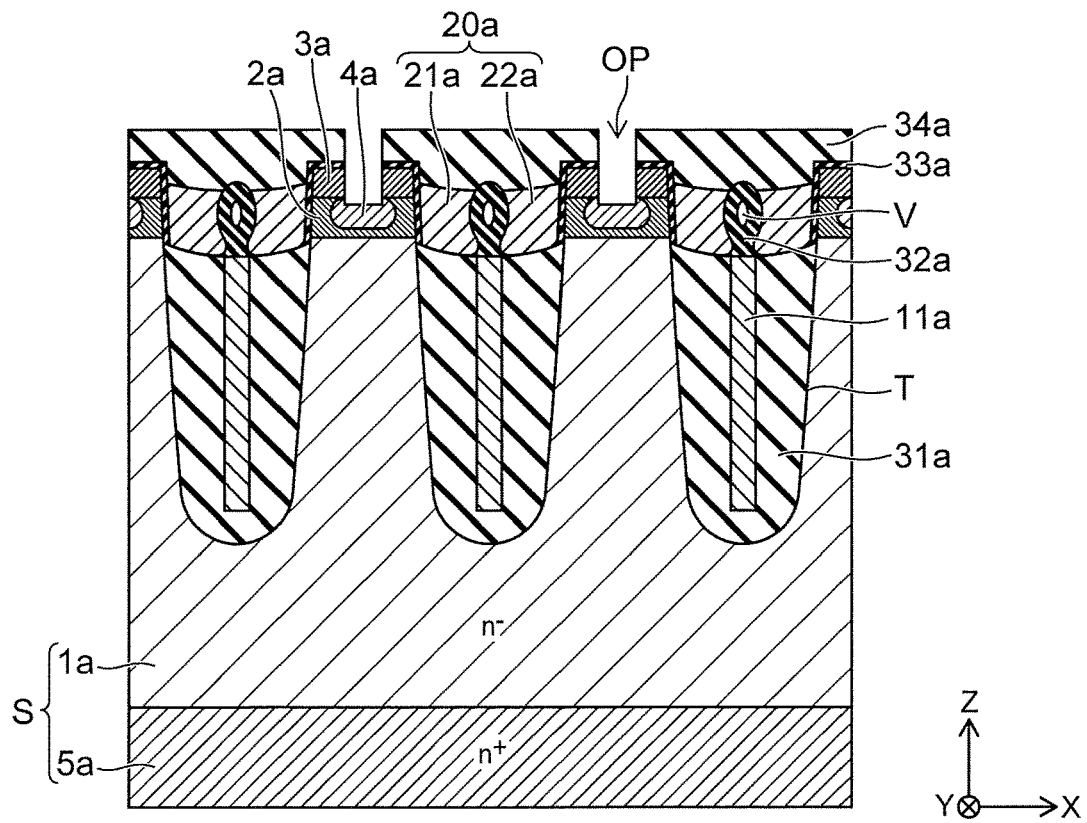

P-type impurities and n-type impurities are sequentially ion-implanted in the upper portion of the n⁻-type semiconductor region 1a between the trenches T to form a plurality of p-type semiconductor region 2a and a plurality of n⁺-type semiconductor region 3a. An insulating layer 34a covering the conductive layers 20a is formed. A portion of the insulating layer 33a and a portion of the insulating layer 34a are removed. Thereby, a plurality of openings OP are formed. For example, in order to form the openings OP, a portion of each n⁺-type semiconductor region 3a and a portion of each p-type semiconductor region 2a are removed. The openings OP respectively reach the p-type semiconductor regions 2a through the n⁺-type semiconductor regions 3a. P-type impurities are ion-implanted into the p-type semiconductor regions 2a through the openings OP to form a plurality of p⁺-type semiconductor regions 4a as shown in FIG. 4B.

A metal layer filling the openings OP is formed on the insulating layer 34a. Thereafter, the lower surface of the semiconductor substrate S is ground until the n⁺-type semiconductor region 5a has a prescribed thickness. Another metal layer is formed on the ground lower surface. Through the above steps, the semiconductor device 100 shown in FIG. 1 is manufactured.

Figure 5:
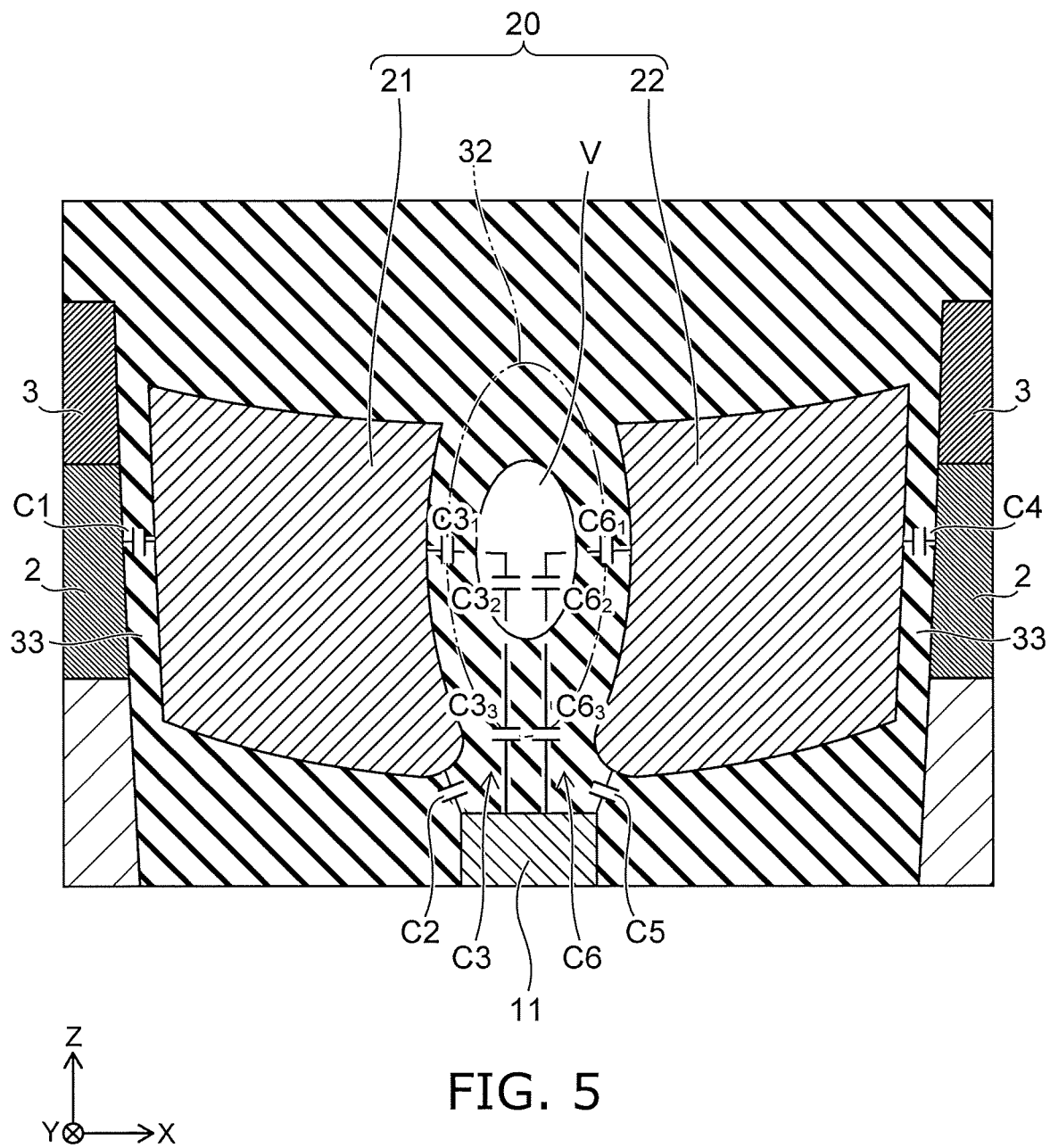
FIG. 5 is an enlarged cross-sectional view showing the vicinity of the gate electrode of the semiconductor device according to the embodiment.

FIG. 5 is an enlarged cross-sectional view showing the vicinity of the gate electrode of the semiconductor device according to the embodiment.

The effect of the embodiment will be described with reference to FIG. 5. In the semiconductor device 100 according to the embodiment, capacitances C1 to C3 exist between the first electrode portion 21 and the source electrode 42, as shown in FIG. 5.

The capacitance C1 indicates a capacitive component generated between the first electrode portion 21 and the p-type base region 2. The capacitances C2 and C3 indicate capacitive components generated between the first electrode portion 21 and the first conductive portion 11. The capacitance C2 indicates a capacitive component generated in the shortest path between the first electrode portion 21 and the first conductive portion 11. The capacitance C3 indicates a capacitive component generated in the path passing through the void V. The capacitance between the first electrode portion 21 and the source electrode 42 is represented by the sum of the capacitances C1 to C3.

The capacitance C3 is composed of a capacitance $C3_1$, a capacitance $C3_2$, and a capacitance $C3_3$. The capacitance $C3_1$ indicates a capacitive component generated between the first electrode portion 21 and the void V. The capacitance $C3_2$ indicates a capacitive component generated in the void V. The capacitance $C3_3$ indicates a capacitive component generated between the void V and the first conductive portion 11.

The void V includes, for example, air. The void V may include a mixed gas of oxygen and hydrogen. The void V may be decompressed. In any case, the relative permittivity in the void V is lower than a relative permittivity of an insulator. Therefore, according to the embodiment, the capacitance $C3_2$ can be reduced as compared with the case where the void V is not provided and an oxide is provided instead of the void V. The reduction of the capacitance $C3_2$ can reduce the capacitance C3. As a result, the capacitance between the first electrode portion 21 and the source electrode 42 can be reduced. By reducing the capacitance between the first electrode portion 21 and the source electrode 42, the switching speed of the semiconductor device 100 can be improved, and the switching loss of the semiconductor device 100 can be reduced.

Similar to the capacitances C1 to C3, capacitances C4 to C6 exist between the second electrode portion 22 and the source electrode 42. The capacitance C4 indicates a capacitive component generated between the second electrode portion 22 and the p-type base region 2. Capacitances C5 and C6 indicate capacitive components generated between the second electrode portion 22 and the first conductive portion 11. The capacitance C5 indicates a capacitive component generated in the shortest path between the second electrode portion 22 and the first conductive portion 11. The capacitance C6 indicates a capacitive component generated in the path passing through the void V. The capacitance between the second electrode portion 22 and the source electrode 42 is represented by the sum of the capacitances C4 to C6.

The capacitance C6 is composed of a capacitance $C6_1$, a capacitance $C6_2$, and a capacitance $C6_3$. The capacitance $C6_1$ indicates a capacitive component generated between the second electrode portion 22 and the void V. The capacitance $C6_2$ indicates a capacitive component generated in the void V. The capacitance $C6_3$ indicates a capacitive component generated between the void V and the first conductive portion 11.

According to the embodiment, the capacitance $C6_2$ can be reduced as compared with the case where an oxide is provided instead of the void V. As a result, the capacitance between the second electrode portion 22 and the source electrode 42 can be reduced, and the switching loss of the semiconductor device 100 can be reduced.

Another effect of the embodiment will be described. The second insulating portion 32 is surrounded by the first conductive portion 11, the first electrode portion 21, and the second electrode portion 22. When the void V is provided inside the second insulating portion 32 surrounded by these components, the occurrence of the dielectric breakdown between the first conductive portion 11 and the gate electrode 20 can be suppressed, and the reliability of the semiconductor device 100 can be improved.

A dielectric breakdown between conductors set to different potentials is described, for example, using a specific model called a percolation model. The outline of the percolation model is as follows. When a voltage is applied between the two conductors, spherical electron traps (defects) occur at random in the insulator between the conductors. As time passes, electron traps increase. When two conductors are connected by the electron traps, the dielectric breakdown occurs.

In the void V, the electron trap described above does not occur. Therefore, when the void V is provided, the connection due to the electron traps between the first conductive portion 11 and the gate electrode 20 is less likely to occur. As a result, the occurrence of the dielectric breakdown between the first conductive portion 11 and the gate electrode 20 can be suppressed, and the reliability of the semiconductor device 100 can be improved.

Still another effect of the embodiment will be described. When the void V is provided inside the second insulating portion 32, the stress applied to the semiconductor substrate S can be relaxed in the manufacturing processes of the semiconductor device 100. Specifically, a compressive stress is generated on the $n^-$-type semiconductor region 1a side of the semiconductor substrate S in the manufacturing processes of the semiconductor device 100. For example, when phosphorus is diffused into the conductive layer 20a for forming the gate electrode after the step shown in FIG. 3B, the volume of the conductive layer 20a expands and a large compressive stress is generated. When the void V is provided, a portion of the void V is crushed, and the compressive stress can be relaxed. As a result, for example, the occurrence of the crystal defects in the $n^-$-type semiconductor region 1a due to the compressive stress can be suppressed, and the leakage current between the drain electrode 41 and the source electrode 42 can be reduced.

In the manufacturing processes of the semiconductor device 100, it is desirable that the oxidation rate of the conductive layer 11a in the first oxidation process is larger so that the void V is more easily formed or the volume of the void V is larger. In order to increase the oxidation rate of the conductive layer 11a, it is effective that the conductive layer 11a includes an impurity (for example, phosphorus). Furthermore, by heating the semiconductor substrate S in a gas including oxygen ($O_2$) and hydrogen ($H_2$), the oxidation rate of the conductive layer 11a can be further increased. When the width (the length in the X-direction) of the conductive layer 11a is wide, it takes time to oxidize the exposed upper portion of the conductive layer 11a in the first oxidation process. If the exposed upper portion is not completely oxidized in the X-direction, the void V may not be formed.

Therefore, it is desirable the width of the upper portion of the conductive layer 11a is 400 nm or less in the state shown in FIG. 2B.

By increasing the volume of the void V, the occurrence of the dielectric breakdown between the first conductive portion 11 and the gate electrode 20 can be further suppressed, and the leakage current between the drain electrode 41 and the source electrode 42 can be further reduced.

(First Modification)

Figure 6:
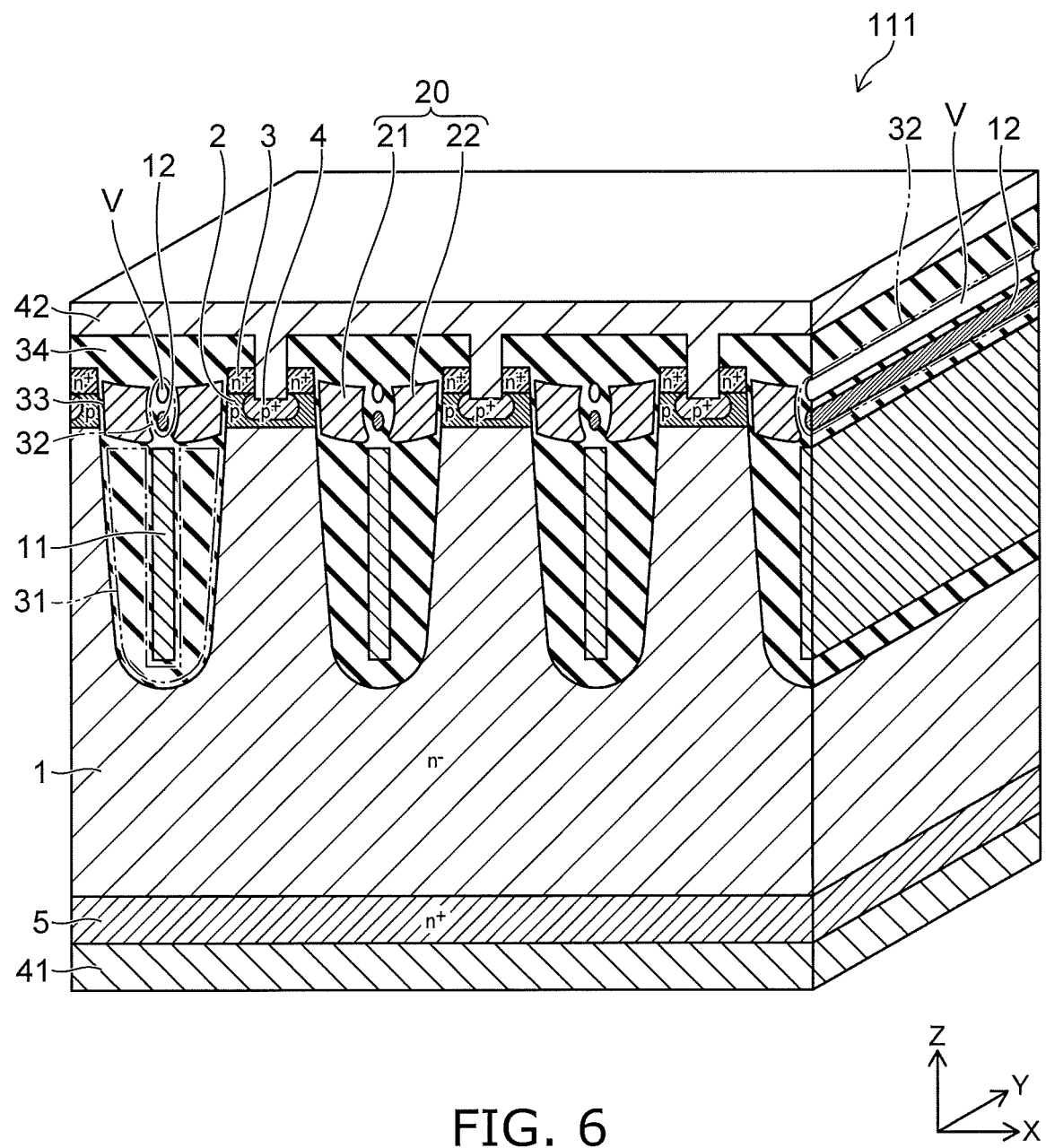
FIG. 6 and FIG. 7 are perspective cross-sectional views showing portions of semiconductor devices according to a first modification.
Figure 7:
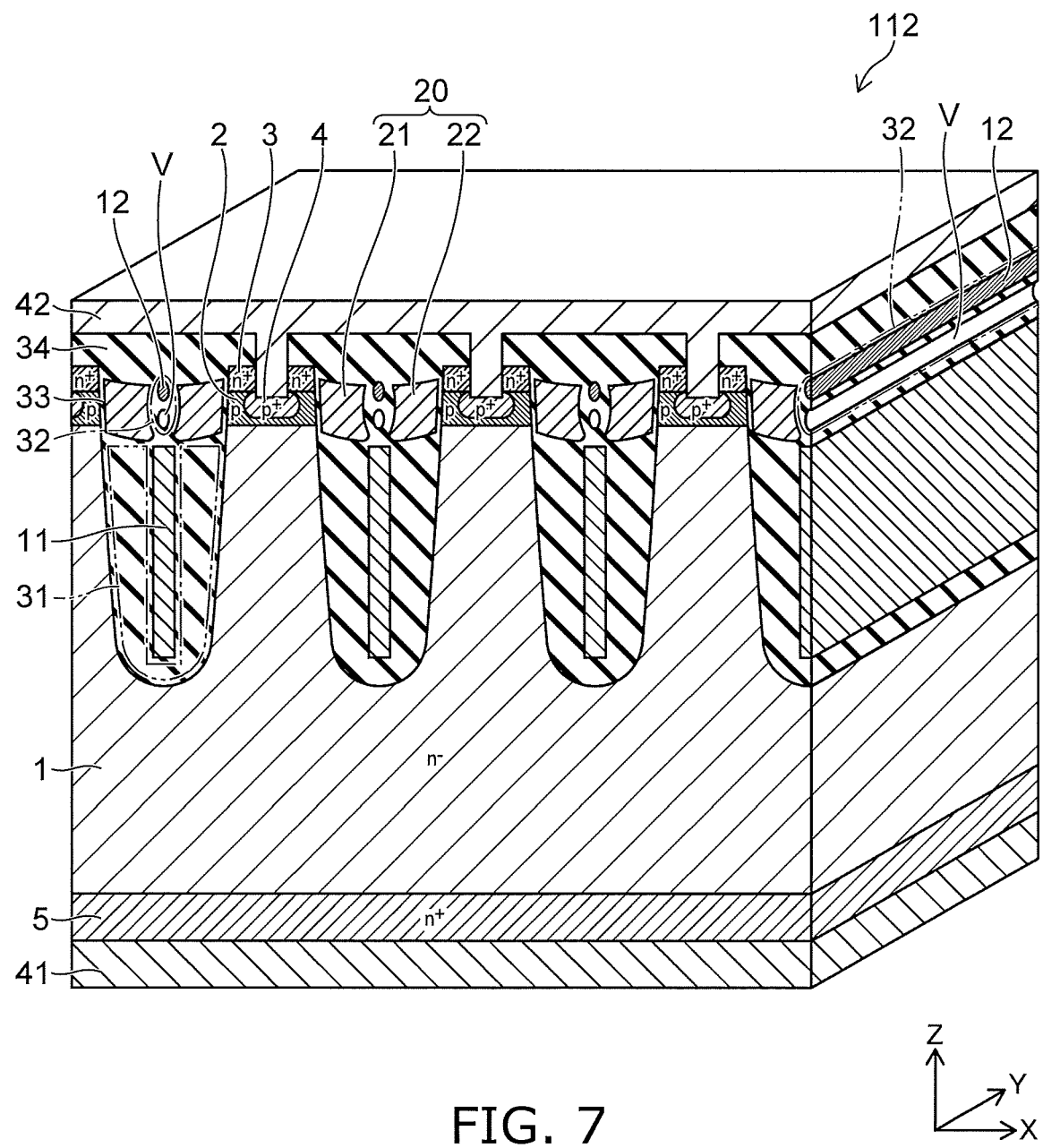

FIG. 6 and FIG. 7 are perspective cross-sectional views showing portions of semiconductor devices according to a first modification.

The semiconductor device 111 shown in FIG. 6 further includes a second conductive portion 12. The second conductive portion 12 is provided between the first electrode portion 21 and the second electrode portion 22. The second conductive portion 12 is surrounded by the second insulating portion 32. The second conductive portion 12 is separated from the first conductive portion 11, the first electrode portion 21, the second electrode portion 22, and the void V. The second conductive portion 12 is located between the first conductive portion 11 and the void V in the Z-direction. For example, the second conductive portion 12 is electrically connected to the source electrode 42. Or, the potential of the second conductive portion 12 may be floating.

In the semiconductor device 112 shown in FIG. 7, the second conductive portion 12 is provided above the void V. The void V is located between the first conductive portion 11 and the second conductive portion 12 in the Z-direction.

The second conductive portion 12 is part of the exposed portion which is not oxidized when the exposed portion of the conductive layer 11a is oxidized in the first oxidation process. The position where the second conductive portion 12 is formed is considered to depend on the shape of the exposed portion.

Figure 8A:
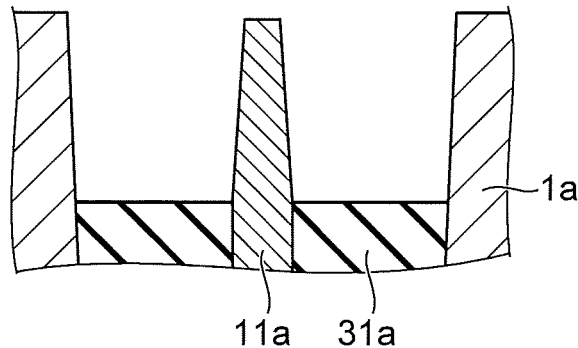
FIG. 8A to FIG. 8D are cross-sectional views showing manufacturing processes of the semiconductor devices according to the first modification.
Figure 8B:
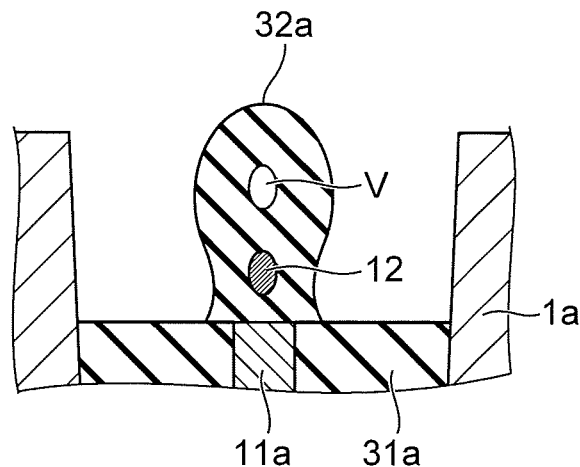
Figure 8C:
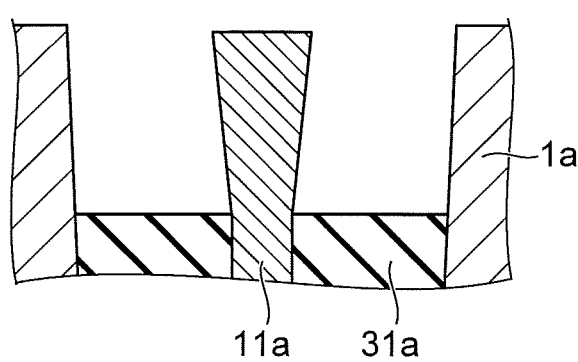

FIG. 8A to FIG. 8D are cross-sectional views showing manufacturing processes of the semiconductor devices according to the first modification. FIG. 8A and FIG. 8C show the vicinity of the exposed portion of the conductive layer 11a after the process shown in FIG. 3A is performed.

In the example shown in FIG. 8A, the width of the exposed portion increases downward. In this case, the upper portion of the exposed portion having relatively narrow width is all oxidized, and the void V is formed as shown in FIG. 8B. The lower portion of the exposed portion having relatively wide width is not completely oxidized, and the second conductive portion 12 is formed.

Figure 8D:
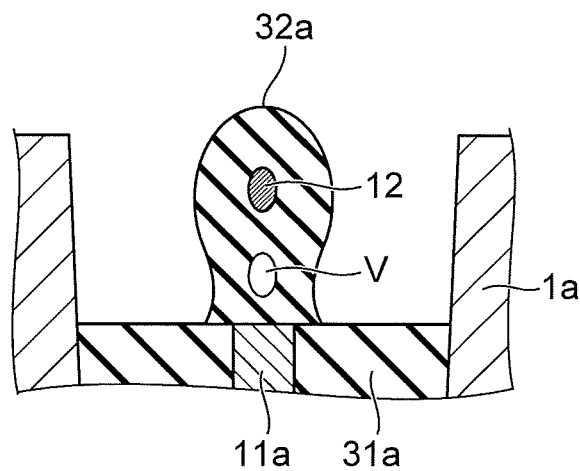

In the example shown in FIG. 8C, the width of the exposed portion increases upward. In this case, the lower portion of the exposed portion having relatively narrow width is all oxidized, and the void V is formed as shown in FIG. 8D. The upper portion of the exposed portion having relatively wide width is not completely oxidized, and the second conductive portion 12 is formed.

(Second Modification)

Figure 9:
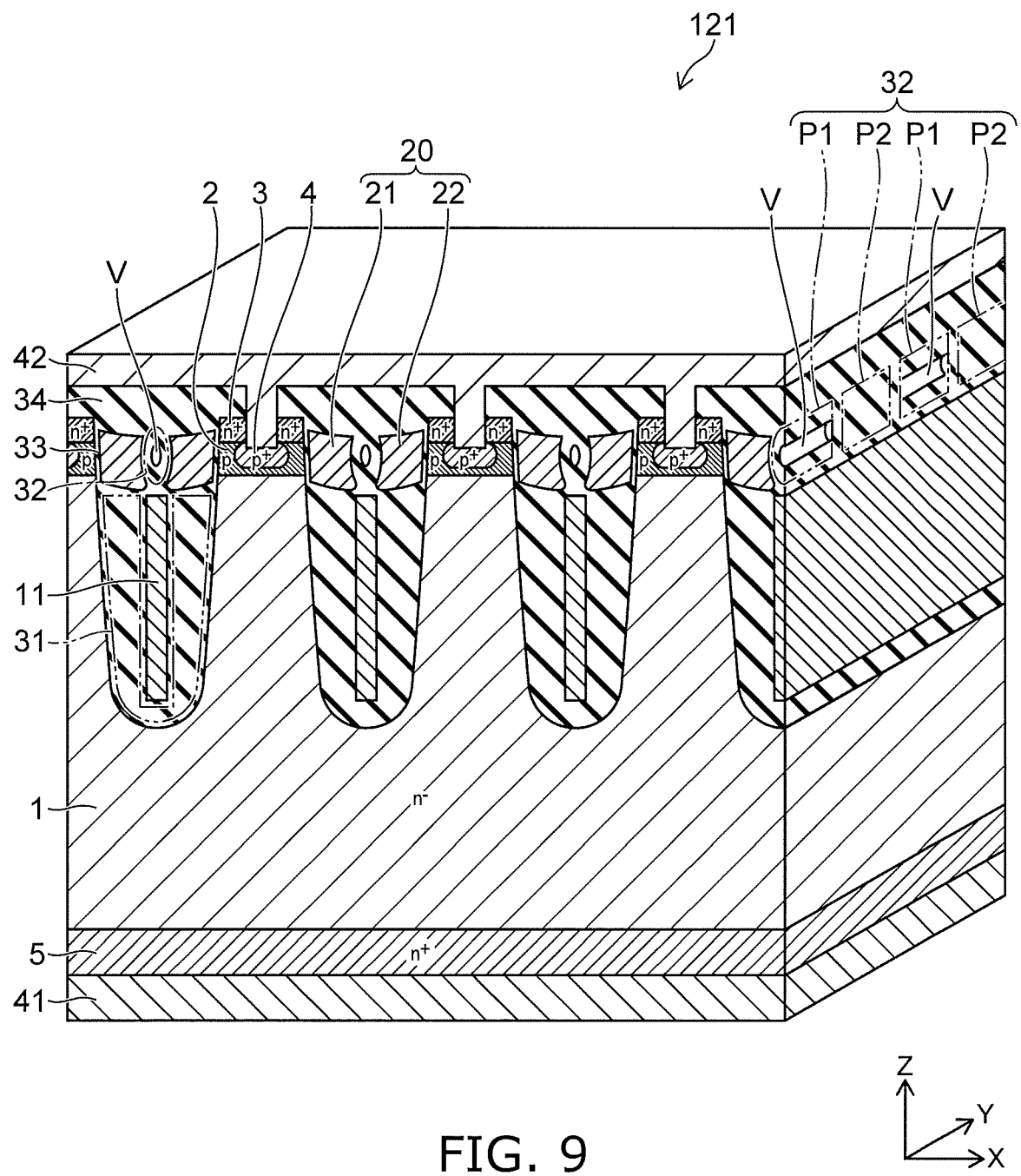
FIG. 9 to FIG. 11 are perspective cross-sectional views showing portions of semiconductor devices according to a second modification.
Figure 10:
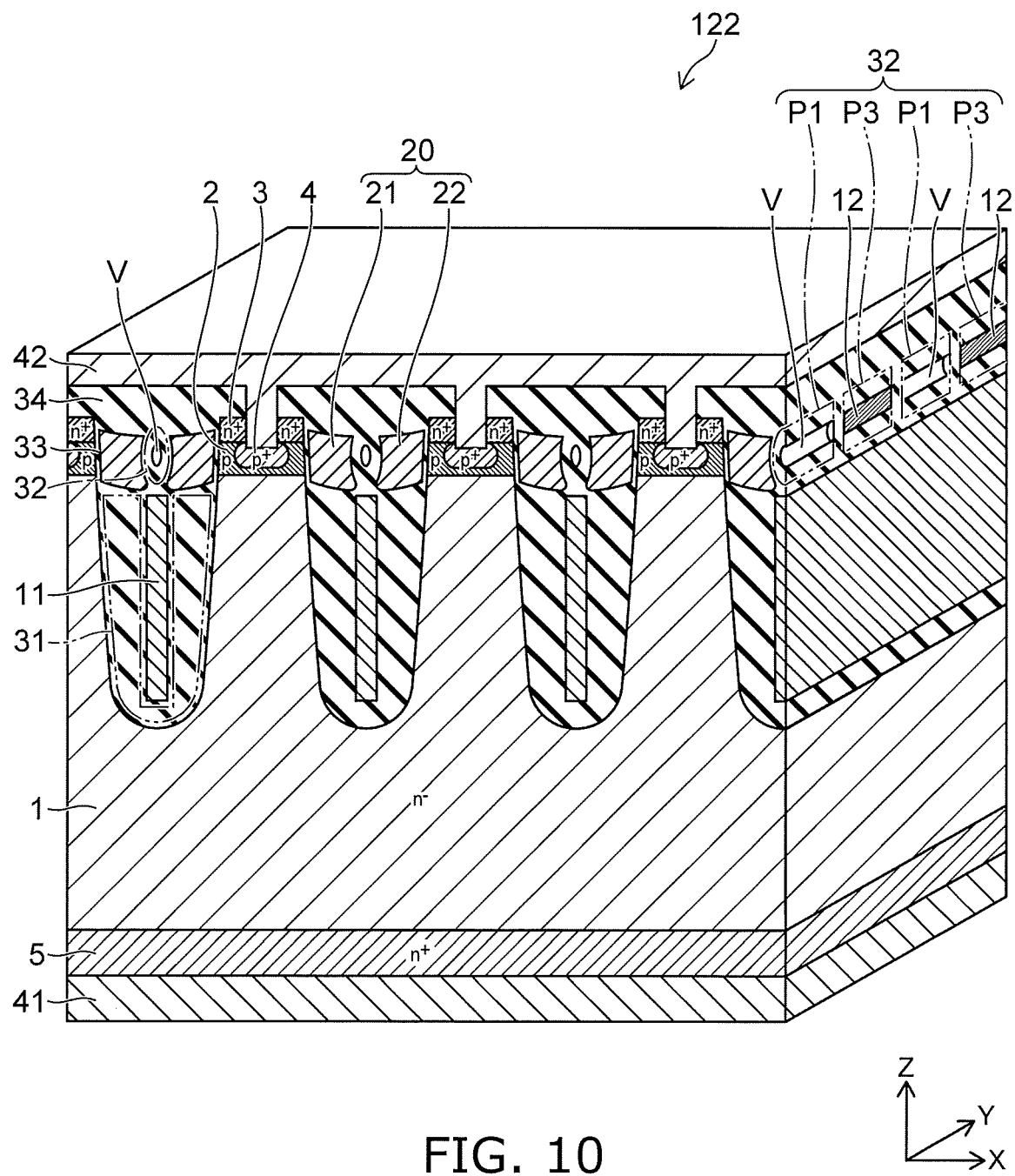
Figure 11:
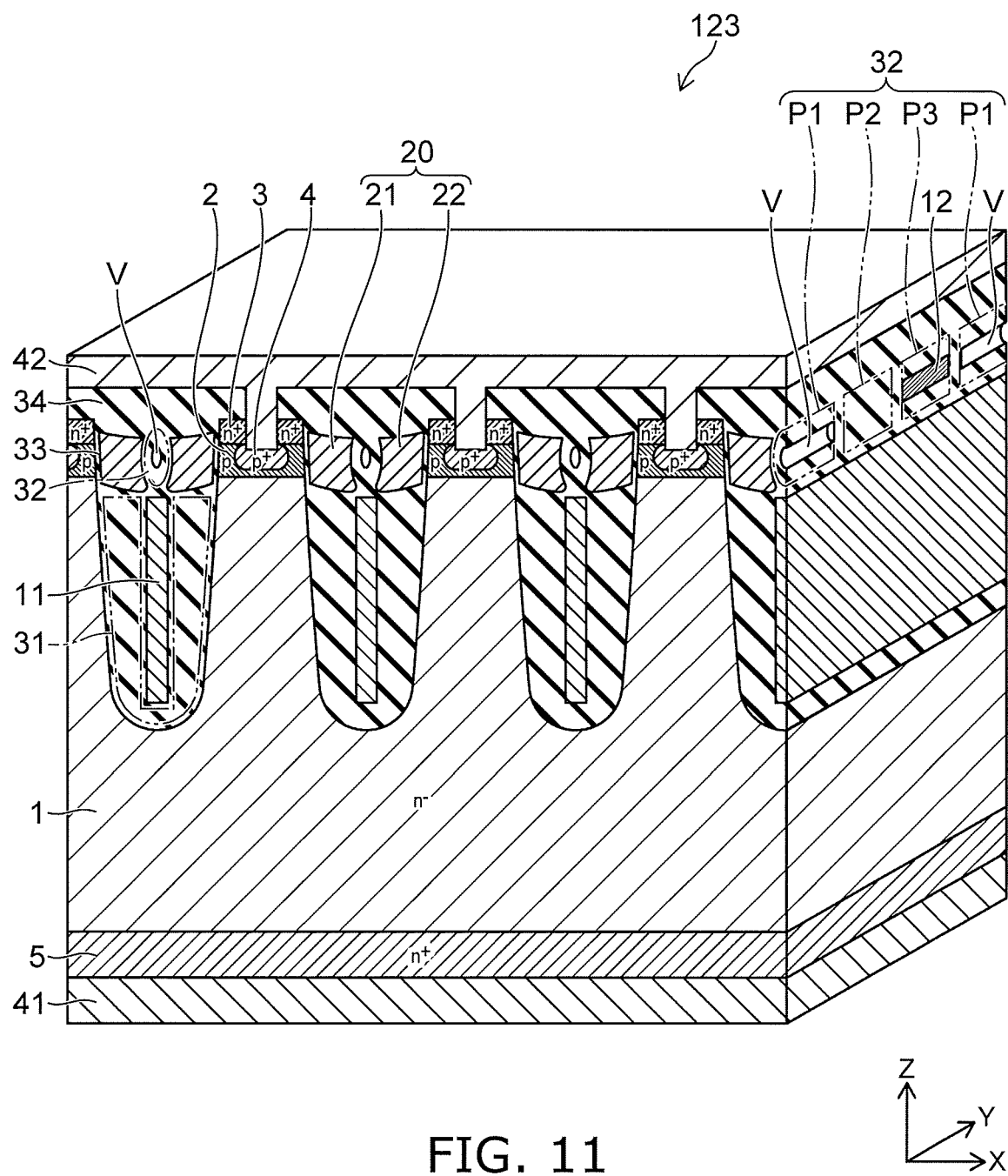

FIG. 9 to FIG. 11 are perspective cross-sectional views showing portions of semiconductor devices according to a second modification.

In the semiconductor device 121 shown in FIG. 9, the second insulating portion 32 includes a first insulating part P1 and a second insulating part P2. The void V is provided inside the first insulating part P1. The void V is not provided in the second insulating part P2. The second insulating part P2 is aligned with the first insulating part P1 in the Y-direction. For example, the first insulating parts P1 and the second insulating parts P2 are alternately provided in the Y-direction.

In the semiconductor device 122 shown in FIG. 10, the second insulating portion 32 includes the first insulating part P1 and a third insulating part P3. The second conductive portion 12 is provided inside the third insulating part P3. The void V is not provided inside the third insulating part P3. The third insulating part P3 is aligned with the first insulating part P1 in the Y-direction. For example, at least a portion of the second conductive portion 12 is aligned with the void V in the Y-direction. For example, the first insulating parts P1 and the third insulating parts P3 are alternately provided in the Y-direction.

In the semiconductor device 123 shown in FIG. 11, the second insulating portion 32 includes the first to third insulating parts P1 to P3. The first to third insulating parts P1 to P3 are aligned with each other in the Y-direction. The order of the first to third insulating parts P1 to P3 is not limited to the example shown in FIG. 11 and is arbitrary.

(Third Modification)

Figure 12:
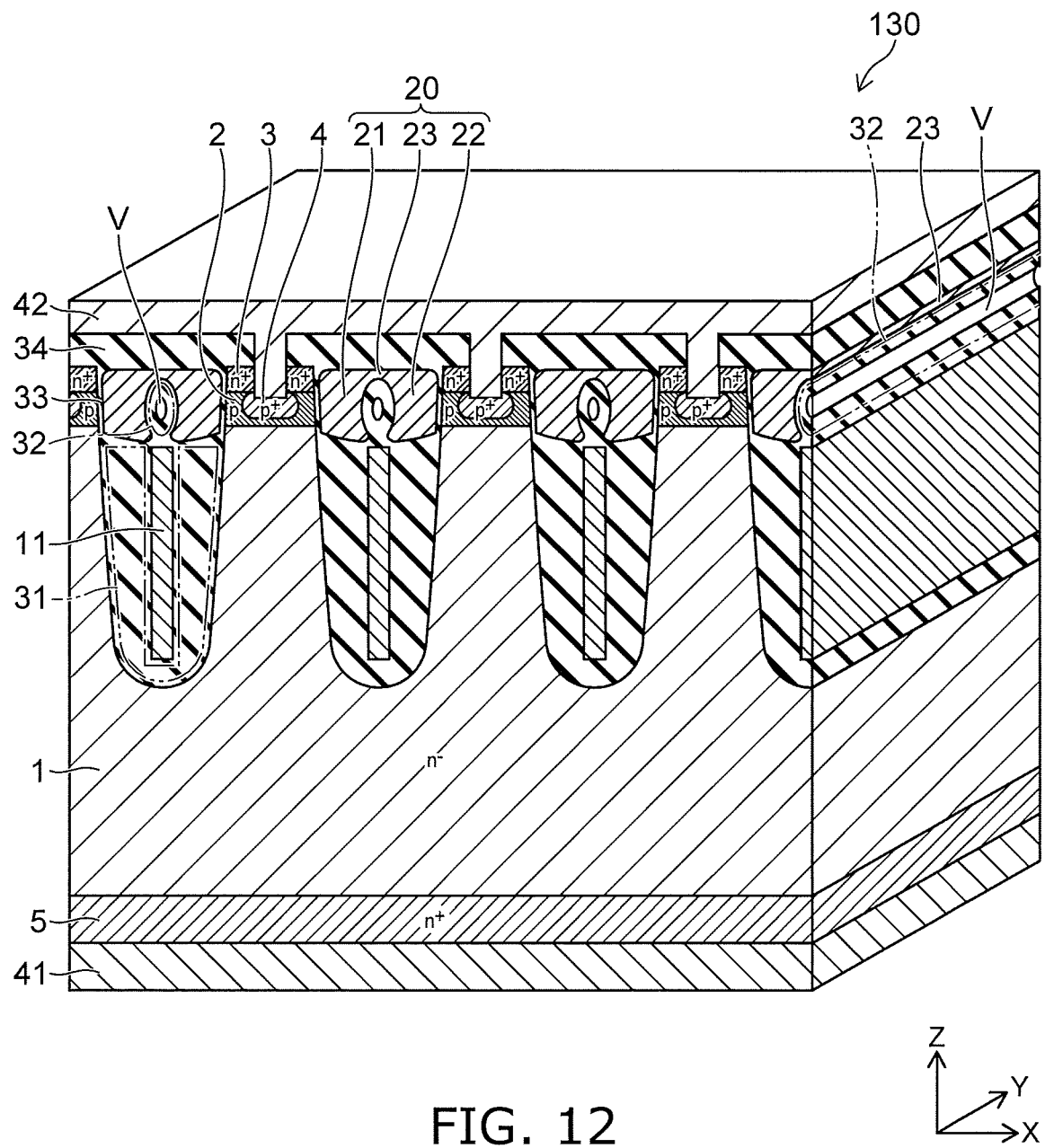
FIG. 12 is a perspective cross-sectional view showing a portion of a semiconductor device according to a third modification.

FIG. 12 is a perspective cross-sectional view showing a portion of a semiconductor device according to a third modification.

In the semiconductor device 130 shown in FIG. 12, the gate electrode 20 further includes a third electrode portion 23. The third electrode portion 23 connects the upper portion of the first electrode portion 21 and the upper portion of the second electrode portion 22. The third electrode portion 23 is located on the second insulating portion 32.

According to each modification described above, similar to the embodiment, it is possible to reduce the switching loss of the semiconductor device, to improve the reliability of the semiconductor device, and to reduce the leakage current in the semiconductor device.

The structures of the modifications described above can be combined as appropriate. For example, in the semiconductor device according to the first modification or the second modification, the gate electrode 20 may include the third electrode portion 23.

It is possible to confirm the relative levels of the impurity concentrations of the semiconductor regions in the embodiments described above, for example, using a scanning capacitance microscope (SCM). The carrier concentrations of the semiconductor regions may be considered to be equal to the activated impurity concentrations of the semiconductor regions. Accordingly, the relative levels of the carrier concentrations of the semiconductor regions can be confirmed using SCM. It is possible to measure the impurity concentrations of the semiconductor regions, for example, using a secondary ion mass spectrometer (SIMS).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. Moreover, above-mentioned embodiments can be combined mutually and can be carried out.

What is claimed is:

1. A semiconductor device, comprising:
  a first electrode;
  a first semiconductor region provided on the first electrode, the first semiconductor region being of a first conductivity type and being electrically connected to the first electrode;

a plurality of second semiconductor regions provided on the first semiconductor region, the plurality of second semiconductor regions being of a second conductivity type;

a plurality of third semiconductor regions selectively provided on the respective second semiconductor regions, the plurality of third semiconductor regions being of the first conductivity type;

a first conductive portion provided inside the first semiconductor region with a first insulating portion interposed;

a gate electrode provided on the first conductive portion and the first insulating portion, the gate electrode being separated from the first conductive portion, the gate electrode including a first electrode portion opposing, with a first gate insulating portion interposed, a portion of the first semiconductor region, one of the plurality of second semiconductor regions, and one of the plurality of third semiconductor regions in a first direction perpendicular to a second direction, the second direction being from the first electrode toward the first semiconductor region, and a second electrode portion located between the first electrode portion and another one of the plurality of third semiconductor regions in the first direction, the second electrode portion opposing, with a second gate insulating portion interposed, another portion of the first semiconductor region, another one of the plurality of second semiconductor regions, and the other one of the plurality of third semiconductor regions, a second insulating portion including a void being provided between the first electrode portion and the second electrode portion; and a second electrode provided on the plurality of second semiconductor regions and the plurality of third semiconductor regions, the second electrode being electrically connected to the plurality of second semiconductor regions, the plurality of third semiconductor regions, and the first conductive portion.

2. The device according to claim 1, further comprising a second conductive portion provided inside the second insulating portion, the second conductive portion being separated from the first conductive portion and the gate electrode.

3. The device according to claim 2, wherein the second conductive portion is electrically connected to the second electrode.

4. The device according to claim 1, wherein the second insulating portion includes
a first insulating part including the void, and
a second insulating part aligned with the first insulating part in a third direction perpendicular to the first direction and the second direction, the second insulating part not including the void.

5. The device according to claim 1, further comprising a second conductive portion provided inside the second insulating portion,
the second conductive portion being separated from the first conductive portion and the gate electrode,
the second insulating portion including
a first insulating part including the void, and
a third insulating part aligned with the first insulating part in a third direction perpendicular to the first direction and the second direction, the third insulating part including the second conductive portion and not including the void.

6. The device according to claim 1, wherein
the gate electrode further includes a third electrode portion provided on the second insulating portion, and
the third electrode portion is connected to an upper portion of the first electrode portion and an upper portion of the second electrode portion.

7. The device according to claim 1, wherein
the second insulating portion includes an impurity, and
an impurity concentration in the second insulating portion is higher than an impurity concentration in the first insulating portion.

* * * * *